(12) United States Patent
Miller

(10) Patent No.: US 11,382,178 B2
(45) Date of Patent: Jul. 5, 2022

(54) SYSTEM AND METHOD FOR HEATING AN ELECTRICAL BUS IN AN ELECTRICAL CABINET FOR COLD STARTUP AND CONDENSATION/FROST CONTROL

(71) Applicant: General Electric Company, Schenectady, NY (US)

(72) Inventor: Zane Taylor Miller, Christiansburg, VA (US)

(73) Assignee: General Electric Company, Schenectady, NY (US)

(*) Notice: Subject to any disclaimer, the term of this patent is extended or adjusted under 35 U.S.C. 154(b) by 398 days.

(21) Appl. No.: 16/454,895

(22) Filed: Jun. 27, 2019

(65) Prior Publication Data
US 2020/0413492 A1 Dec. 31, 2020

(51) Int. Cl.
| | |
|---|---|
| *H05B 1/02* | (2006.01) |
| *F03D 80/40* | (2016.01) |
| *F03D 80/60* | (2016.01) |
| *H05B 3/00* | (2006.01) |

(52) U.S. Cl.
CPC ............ *H05B 1/023* (2013.01); *F03D 80/40* (2016.05); *F03D 80/60* (2016.05); *H05B 3/00* (2013.01); *H05B 3/0004* (2013.01); *H05B 3/0014* (2013.01); *H05B 3/0019* (2013.01); *H05B 3/0023* (2013.01); *H05B 3/0038* (2013.01)

(58) Field of Classification Search
None
See application file for complete search history.

(56) References Cited

U.S. PATENT DOCUMENTS

| | | | | |
|---|---|---|---|---|
| 3,300,593 | A | * | 1/1967 | Luberts ............... H02G 5/04 191/27 |
| 3,444,399 | A | * | 5/1969 | Jones ............. G05D 23/1902 307/117 |
| 4,093,355 | A | * | 6/1978 | Kaplit ............ G02F 1/133382 219/209 |
| 4,374,316 | A | * | 2/1983 | Inamori ............. H01L 23/345 219/209 |
| RE34,179 | E | * | 2/1993 | Eccleston ........... H01L 25/167 257/467 |

(Continued)

FOREIGN PATENT DOCUMENTS

| | | |
|---|---|---|
| CN | 104104311 B | 4/2017 |
| EP | 3104511 A1 | 12/2016 |

OTHER PUBLICATIONS

European Search Report, dated Oct. 28, 2020, for EP Application No. 20181451.4.

*Primary Examiner* — Thor S Campbell
(74) *Attorney, Agent, or Firm* — Dority & Manning, P.A.

(57) ABSTRACT

A method for heating an electrical bus in an electrical cabinet containing at least one current conversion device includes determining a temperature inside of the electrical cabinet. The method also includes determining a temperature outside of the electrical cabinet. Further, the method includes applying heat to the electrical bus via conduction when the temperature outside of the electrical cabinet is below a predetermined temperature threshold or a difference between the temperature inside of the electrical cabinet and the temperature outside of the electrical cabinet is less than a desired temperature difference.

14 Claims, 6 Drawing Sheets

(56) References Cited

U.S. PATENT DOCUMENTS

| | | | | |
|---|---|---|---|---|
| 5,204,509 A * | 4/1993 | Etters | | H01H 1/62 |
| | | | | 219/201 |
| 5,486,681 A * | 1/1996 | Dagnac | | H05K 7/20 |
| | | | | 219/385 |
| 6,043,464 A * | 3/2000 | Berger | | F24F 11/0008 |
| | | | | 165/80.3 |
| 6,079,483 A * | 6/2000 | Morooka | | F24F 11/0008 |
| | | | | 165/11.1 |
| 6,114,674 A * | 9/2000 | Baugh | | H01C 13/00 |
| | | | | 174/250 |
| 6,145,787 A * | 11/2000 | Rolls | | F03D 1/065 |
| | | | | 244/134 R |
| 6,262,392 B1 * | 7/2001 | Morton | | H05B 3/00 |
| | | | | 219/209 |
| 6,423,940 B1 * | 7/2002 | Schupbach | | G05D 23/1919 |
| | | | | 219/209 |
| 6,621,055 B2 * | 9/2003 | Weber | | H05B 3/26 |
| | | | | 219/494 |
| 6,694,093 B2 * | 2/2004 | Morris | | F24H 9/2028 |
| | | | | 219/523 |
| 6,781,056 B1 * | 8/2004 | O'Rourke | | H05K 1/0212 |
| | | | | 174/255 |
| 7,312,593 B1 | 12/2007 | Streicher et al. | | |
| 7,335,855 B2 * | 2/2008 | von der Luhe | | H01C 1/014 |
| | | | | 219/201 |
| 8,692,349 B2 * | 4/2014 | Kim | | H01L 23/34 |
| | | | | 257/467 |
| 8,981,259 B2 * | 3/2015 | Chou | | H05B 3/26 |
| | | | | 219/209 |
| 9,693,446 B2 * | 6/2017 | Ragg | | H05K 1/0212 |
| 10,270,918 B2 * | 4/2019 | Bowers | | G06F 1/263 |
| 10,364,802 B2 * | 7/2019 | Schult | | F03D 7/0284 |
| 10,787,267 B2 * | 9/2020 | Paulson | | H05B 3/0004 |
| 10,973,141 B2 * | 4/2021 | Dauzat | | H05K 7/20336 |
| 2003/0089700 A1 * | 5/2003 | Chang | | H05B 1/0252 |
| | | | | 219/505 |
| 2009/0195923 A1 * | 8/2009 | Strom | | G11B 19/046 |
| | | | | 360/98.07 |
| 2015/0244297 A1 * | 8/2015 | Niemoeller | | F03D 7/0284 |
| | | | | 290/44 |
| 2020/0146112 A1 * | 5/2020 | de Bock | | H05B 1/0236 |

* cited by examiner

SYSTEM AND METHOD FOR HEATING AN ELECTRICAL BUS IN AN ELECTRICAL CABINET FOR COLD STARTUP AND CONDENSATION/FROST CONTROL

FIELD

The present disclosure relates generally to an electrical cabinet, such as power converter and, more particularly, to a system and method for heating the electrical bus in the electrical cabinet for cold startup and condensation/frost control.

BACKGROUND

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy of wind using known airfoil principles. For example, rotor blades typically have the cross-sectional profile of an airfoil such that, during operation, air flows over the blade producing a pressure difference between the sides. Consequently, a lift force, which is directed from a pressure side towards a suction side, acts on the blade. The lift force generates torque on the main rotor shaft, which is geared to a generator for producing electricity.

During operation, wind impacts the rotor blades of the wind turbine and the blades transform wind energy into a mechanical rotational torque that rotatably drives a low-speed shaft. The low-speed shaft is configured to drive the gearbox that subsequently steps up the low rotational speed of the low-speed shaft to drive a high-speed shaft at an increased rotational speed. The high-speed shaft is generally rotatably coupled to a generator so as to rotatably drive a generator rotor. As such, a rotating magnetic field may be induced by the generator rotor and a voltage may be induced within a generator stator that is magnetically coupled to the generator rotor. In certain configurations, the associated electrical power can be transmitted to a turbine transformer that is typically connected to a power grid via a grid breaker. Thus, the turbine transformer steps up the voltage amplitude of the electrical power such that the transformed electrical power may be further transmitted to the power grid.

In many wind turbines, the generator rotor may be electrically coupled to a bi-directional power converter that includes a rotor side converter joined to a line side converter via a regulated DC link. More specifically, some wind turbines, such as wind-driven doubly-fed induction generator (DFIG) systems or full power conversion systems, may include a power converter with an AC-DC-AC topology. In such system, the generator stator is separately connected to the power grid via a main transformer.

The power converter usually includes several power semiconductor devices such as insulated gate bipolar transistors (IGBTs), integrated gate commutated thyristors (IGCTs or GCTs), diodes, and/or metal oxide semiconductor field effect transistors (MOSFETs) that are switched at certain frequencies to generate the desired converter output voltage and frequency. The converter output voltage is then provided to various loads such as motors, power grids, resistive loads, etc.

Power converters and electrical cabinets at large, often employ environmental controls to ensure the environment inside the power converter is safe for the application of voltage. If starting a power converter in a cold weather environment, it is important that all components are warmed above their minimum operating temperature before starting the converter, or the components could fail. Furthermore, in most cases, it is important to warm the cabinet a few degrees above freezing to remove any frost which, when the power converter is started, will melt, drip, and could short components or bus work. Last but not least, even while operating or operating in mild climates, it is important to maintain a small temperature rise in the cabinet to ensure any air which moves into the cabinet does not result in condensation on equipment with applied voltage, thereby causing a short or arc event.

To address the aforementioned issues, conventional power converters use warmed air to create the temperature rise needed to get the components above 0° C. and a few degrees above outside ambient temperature. This is convenient because the heaters can indirectly impart heat to the components and bus work without subjecting themselves to touching a non-ground potential, thus requiring the heater to have significantly increased voltage isolation. One challenge posed by this approach (especially in an air-cooled electrical cabinet, which is designed to flow as much air through/heat out of a cabinet as possible), however, is that the heat escapes.

To overcome this challenge, many conventional power converters employ orders of magnitude of more heat than would be needed to simply heat the components and bus work which needs warming and drying. Furthermore, when warming the cabinet, the fans have to be turned off, otherwise the heat would escape immediately. When the heaters start warming air, that warm air is subject to natural convection currents (i.e. the air rises mostly straight up and out of the cabinet). Therefore, the warm air is not easily distributed to the various corners of the cabinet, which are not in the natural convection path. As such, many conventional power converters overcome this issue by an over-application of numerous heaters within the electrical cabinet to assist with spreading the heat load.

Thus, an improved system and method for heating the electrical bus in the power converter for cold startup and condensation/frost control that addresses the aforementioned issues would be welcomed in the art. Accordingly, the present disclosure is directed to a system and method for heating the electrical bus in the power converter for cold startup and condensation/frost control by applying direct heat conduction to the electrical bus.

BRIEF DESCRIPTION

Aspects and advantages of the invention will be set forth in part in the following description, or may be obvious from the description, or may be learned through practice of the invention.

In one aspect, the present disclosure is directed to a method for heating an electrical bus in an electrical cabinet containing at least one current conversion device. The method includes determining a temperature inside of the electrical cabinet. The method also includes determining a temperature outside of the electrical cabinet. Further, the method includes applying heat to the electrical bus via conduction when the temperature outside of the electrical cabinet is below a predetermined temperature threshold or a difference between the temperature inside of the electrical cabinet and the temperature outside of the electrical cabinet is less than a desired temperature difference.

In an embodiment, the current conversion device(s) may include a power converter or a power inverter.

In one embodiment, applying heat to the electrical bus via conduction may include coupling one or more heaters to the electrical bus. In certain embodiments, the heater(s) may include one or more power resistors.

In particular embodiments, the current conversion device(s) may be a three-phase power system. In such embodiments, the method may include coupling at least one of the one or more power resistors to each phase of the three-phase power system. In another embodiment, the method may include coupling a plurality of the power resistors connected in series to each phase of the three-phase power system.

In further embodiments, the method may include determining ohmic values for each of the power resistors via computer-implemented numerical modeling based on one or more site parameters of the electrical cabinet. In such embodiments, the ohmic values are configured to achieve a desired heat flux for the electrical cabinet.

In additional embodiments, the predetermined temperature threshold may be set to 10 degrees Celsius (° C.), more preferably 5° C., still more preferably 0° C.

In certain embodiments, the component(s) in the current conversion device(s) may include, for example, power bridges or power semiconducting switches such as an insulated-gate bipolar transistor (IGBT), an integrated gate commutated thyristor (IGCT), a gate commutated thyristor (GCT), a diode, a metal oxide semiconductor field effect transistor (MOSFET), as well as a capacitor, a resistor, an inductor, a transformer, a contactor, a fuse, and/or any other suitable electrical devices.

In another aspect, the present disclosure is directed to an electrical power system. The electrical power system includes an electrical cabinet and at least one current conversion device housed within the electrical cabinet. The current conversion device(s) has a plurality of power semiconductor devices connected together via an electrical bus. The electrical power system also includes one or more sensors for determining a temperature inside and outside the electrical cabinet and one or more heaters to the electrical bus. The electrical power system also includes a controller communicatively coupled to the one or more sensors and the one or more heaters. The controller may be a digital or analog controller or combinations thereof. Thus, the controller is configured to command the heater(s) to apply heat to the electrical bus via conduction when the temperature outside of the electrical cabinet is below a predetermined temperature threshold or a difference between the temperature inside of the electrical cabinet and the temperature outside of the electrical cabinet is less than a desired temperature difference. It should be understood that the electrical power system may further include any combination of the additional features as described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
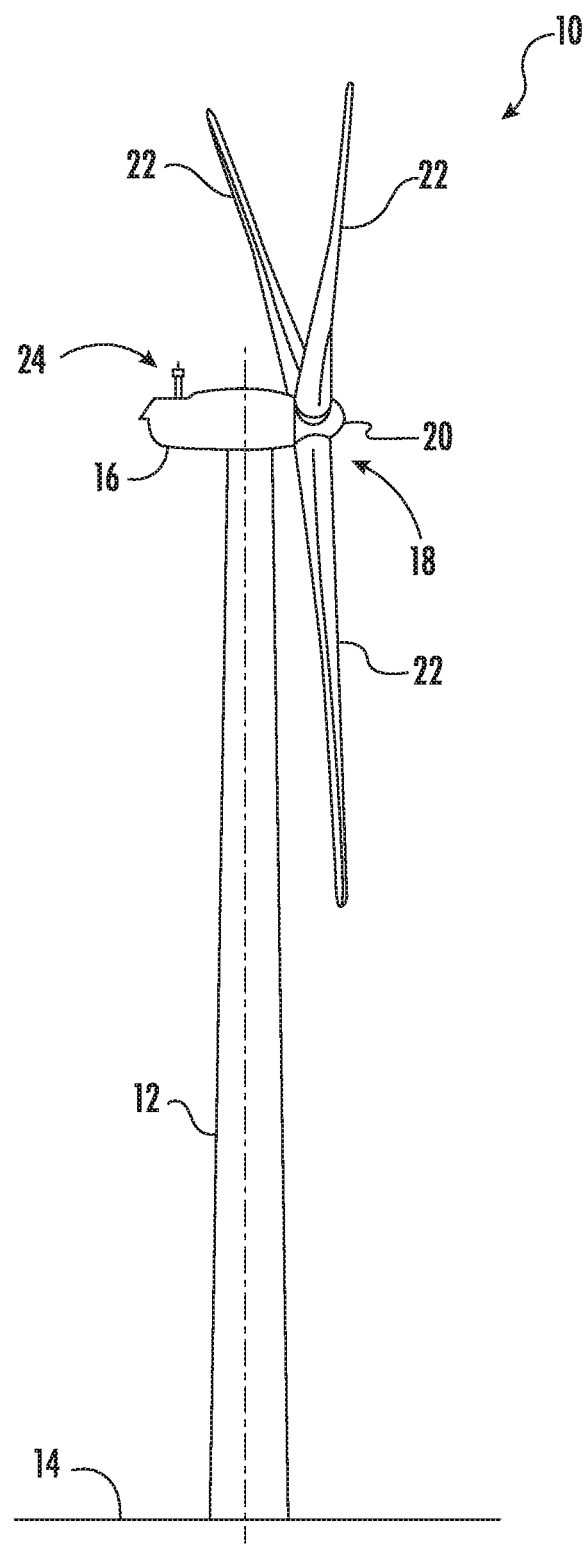
FIG. 1 illustrates a perspective view of an embodiment of a wind turbine according to the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents In general, the present disclosure is directed to systems and methods for heating the electrical bus work of a power converter cabinet by heat conduction via the use of power resistors with or without a thermal interface material therebetween designed to reduce the thermal resistance between the power resistor(s) and the electrical bus. Power resistors (which can be formed of nichrome, copper or any other suitable conductor, infinitely better than air) can be applied directly to the bus. Thus, the bus and the components attached thereto can be directly warmed without having to warm the surrounding air and structures. Thus, the method of the present disclosure is very efficient, in the total amount of energy required to achieve the component temperature rise, relative to the amount of space required and cost for air heaters, as well as in the ability of using the copper or aluminum bus work to distribute the heat to all extents and components, regardless of natural convection flow.

Referring now to the drawings, FIG. 1 illustrates a perspective view of one embodiment of a wind turbine 10. As shown, the wind turbine 10 generally includes a tower 12 extending from a support surface 14, a nacelle 16 mounted on the tower 12, and a rotor 18 coupled to the nacelle 16. The rotor 18 includes a rotatable hub 20 and at least one rotor blade 22 coupled to and extending outwardly from the hub 20. For example, in the illustrated embodiment, the rotor 18 includes three rotor blades 22. However, in an alternative embodiment, the rotor 18 may include more or less than three rotor blades 22. Each rotor blade 22 may be spaced about the hub 20 to facilitate rotating the rotor 18 to enable kinetic energy to be transferred from the wind into usable mechanical energy, and subsequently, electrical energy. For instance, as will be described below, the rotor 18 may be rotatably coupled to an electric generator 120 (FIG. 2) for production of electrical energy. One or more wind conditions, such as wind speed and/or wind direction may also be monitored via a wind sensor 24, such as an anemometer, located on the nacelle 16 or any other suitable location near the wind turbine 10.

Figure 2:
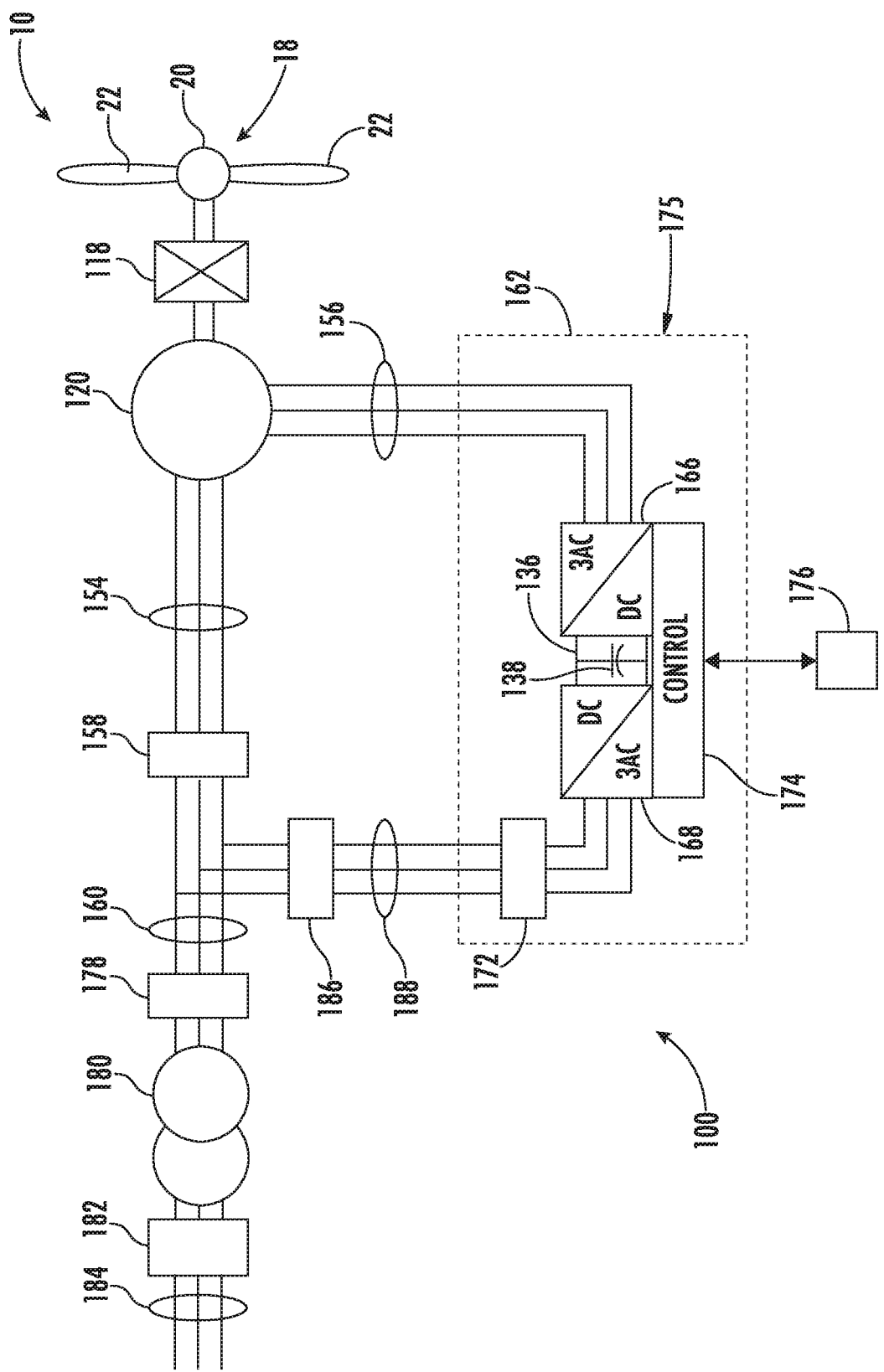
FIG. 2 illustrates a schematic view of one embodiment of a wind turbine electrical power system suitable for use with the wind turbine shown in FIG. 1.

Referring now to FIG. 2, a schematic diagram of one embodiment of a wind turbine DFIG power system 100 ("wind turbine system") is illustrated in accordance with aspects of the present disclosure. Although the present disclosure will generally be described herein with reference to the system 100 shown in FIG. 2, those of ordinary skill in the art, using the disclosures provided herein, should understand that aspects of the present disclosure may also be applicable in other power generation systems, and, as mentioned above, that the invention is not limited to wind turbine systems.

In the embodiment of FIG. 2, the rotor 18 of the wind turbine 10 (FIG. 1) may, optionally, be coupled to a gearbox 118, which is, in turn, coupled to the generator 120, which may be a doubly fed induction generator (DFIG). As shown, the DFIG 120 may be connected to a stator bus 154. Further, as shown, the wind turbine power system 100 may include at least one current conversion device(s) 175, such as a power converter (for wind applications) or a power inverter (e.g. for solar applications). More specifically, as shown, the current conversion device 175 is a power converter 162 connected to the DFIG 120 via a rotor bus 156, and to the stator bus 154 via a line side bus 188. In addition, as shown particularly in FIG. 3, the current conversion device(s) 175 may be housed within an electrical cabinet 177.

As such, the stator bus 154 may provide an output multiphase power (e.g. three-phase power) from a stator of the DFIG 120, and the rotor bus 156 may provide an output multiphase power (e.g. three-phase power) from a rotor of the DFIG 120. The power converter 162 may also include a rotor side converter (RSC) 166 and a line side converter (LSC) 168. The DFIG 120 is coupled via the rotor bus 156 to the rotor side converter 166. Additionally, the RSC 166 is coupled to the LSC 168 via a DC link 136 across which is a DC link capacitor 138. The LSC 168 is, in turn, coupled to the line side bus 188.

The RSC 166 and the LSC 168 may be configured for normal operating mode in a three-phase, pulse width modulation (PWM) arrangement using insulated gate bipolar transistor (IGBT) switching elements, as will be discussed in more detail with respect to FIG. 3.

In addition, the power converter 162 may be coupled to a controller 174 in order to control the operation of the rotor side converter 166 and the line side converter 168. In addition, the controller 174 may be communicatively coupled to the sensors 190, 192 and the heaters 193 described herein so as to control operation thereof. It should be noted that the converter controller 174 may be configured as an interface between the power converter 162 and a local wind turbine control system 176 and may include any number of control devices. In one embodiment, the controller 174 may be a digital controller that includes a processing device (e.g. microprocessor, microcontroller, etc.) executing computer-readable instructions stored in a computer-readable medium. The instructions when executed by the processing device may cause the processing device to perform operations, including providing control commands (e.g. switching frequency commands) to the power semiconductor devices of the power converter 162. Alternatively, the controller may be an analog controller or combinations of both digital and analog controllers.

In typical configurations, various line contactors and circuit breakers including, for example, a grid breaker 182 may also be included for isolating the various components as necessary for normal operation of the DFIG 120 during connection to and disconnection from a load, such as the electrical grid 184. For example, a system circuit breaker 178 may couple the system bus 160 to a transformer 180, which may be coupled to the electrical grid 184 via the grid breaker 182. In alternative embodiments, fuses may replace some or all of the circuit breakers.

In operation, alternating current power generated at the DFIG 120 by rotating the rotor 18 is provided to the electrical grid 184 via dual paths defined by the stator bus 154 and the rotor bus 156. On the rotor bus side 156, sinusoidal multi-phase (e.g. three-phase) alternating current (AC) power is provided to the power converter 162. The rotor side power converter 166 converts the AC power provided from the rotor bus 156 into direct current (DC) power and provides the DC power to the DC link 136. As is generally understood, power semiconductor devices (e.g. IGBTs) used in the bridge circuits of the rotor side power converter 166 may be modulated to convert the AC power provided from the rotor bus 156 into DC power suitable for the DC link 136.

In addition, the LSC 168 converts the DC power on the DC link 136 into AC output power suitable for the electrical grid 184. In particular, power semiconductor devices (e.g. IGBTs) used in bridge circuits of the LSC 168 can be modulated to convert the DC power on the DC link 136 into AC power on the line side bus 188. The AC power from the power converter 162 can be combined with the power from the stator of DFIG 120 to provide multi-phase power (e.g. three-phase power) having a frequency maintained substantially at the frequency of the electrical grid 184 (e.g. 50 Hz or 60 Hz). In certain instances, as mentioned, for an individual DFIG wind turbine power system 100, the reactive power may be supplied primarily by the RSC 166, via the generator 120 and the LSC 168.

Additionally, various circuit breakers and switches, such as grid breaker 182, system breaker 178, stator sync switch 158, converter breaker 186, and line contactor 172 may be included in the wind turbine power system 100 to connect or disconnect corresponding buses, for example, when current flow is excessive and may damage components of the wind turbine power system 100 or for other operational considerations. Additional protection components may also be included in the wind turbine power system 100.

Moreover, the power converter 162 may receive control signals from, for instance, the local control system 176 (also referred to herein as a turbine controller) via the converter controller 174. The control signals may be based, among other things, on sensed states or operating characteristics of the wind turbine power system 100. Typically, the control signals provide for control of the operation of the power converter 162. For example, feedback in the form of a sensed speed of the DFIG 120 may be used to control the conversion of the output power from the rotor bus 156 to maintain a proper and balanced multi-phase (e.g. three-phase) power supply. Other feedback from other sensors may also be used by the controller 174 or control system 176 to control the power converter 162, including, for example, stator and rotor bus voltages and current feedbacks. Using the various forms of feedback information, switching control signals (e.g. gate timing commands for IGBTs), stator synchronizing control signals, and circuit breaker signals may be generated.

The power converter 162 also compensates or adjusts the frequency of the three-phase power from the rotor for changes, for example, in the wind speed at the hub 20 and the blades 22. Therefore, mechanical and electrical rotor frequencies are decoupled and the electrical stator and rotor frequency matching is facilitated substantially independently of the mechanical rotor speed.

Under some states, the bi-directional characteristics of the power converter 162, and specifically, the bi-directional characteristics of the LSC 168 and RSC 166, facilitate feeding back at least some of the generated electrical power into generator rotor 120. More specifically, electrical power may be transmitted from the stator bus 154 to the line side bus 188 and subsequently through the line contactor 172 and into the power converter 162, specifically the LSC 168 which acts as a rectifier and rectifies the sinusoidal, three-phase AC power to DC power. The DC power is transmitted into the DC link 136. The capacitor 138 facilitates mitigating DC link voltage amplitude variations by facilitating mitigation of a DC ripple sometimes associated with three-phase AC rectification.

The DC power is subsequently transmitted to the RSC 166 that converts the DC electrical power to a three-phase, sinusoidal AC electrical power by adjusting voltages, currents, and frequencies. This conversion is monitored and controlled via the converter controller 174. The converted AC power is transmitted from the RSC 166 via the rotor bus 156 to the generator rotor. In this manner, generator reactive power control is facilitated by controlling rotor current and voltage.

Figure 3:
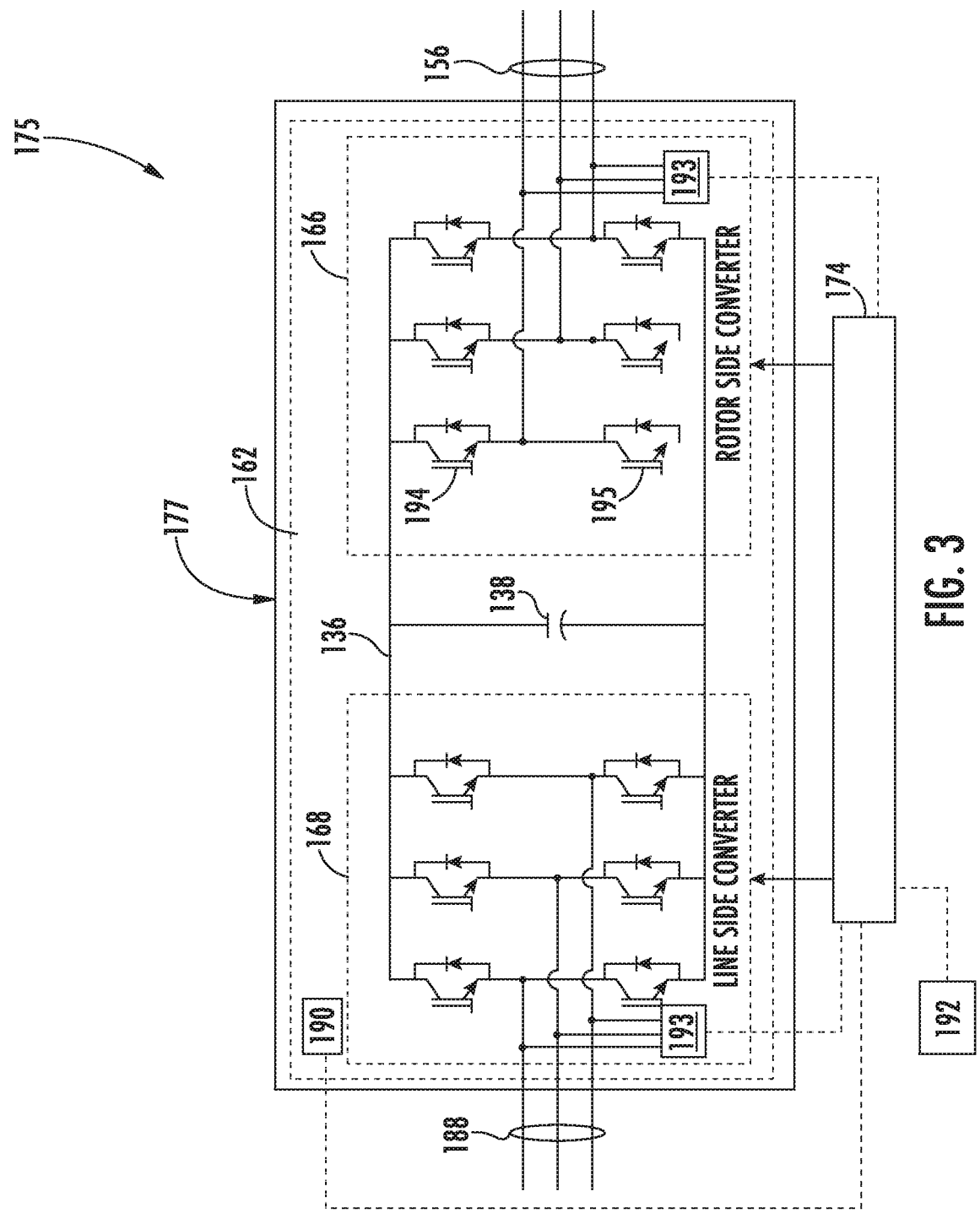
FIG. 3 illustrates a schematic diagram of one embodiment of a power converter of a wind turbine according to the present disclosure.

Referring now to FIG. 3, a detailed, schematic diagram of one embodiment of the power converter 162 shown in FIG. 2 is illustrated in accordance with aspects of the present disclosure. As shown, the RSC 166 includes a plurality of bridge circuits (e.g. H-bridge circuits), with each phase of the rotor bus 156 input to the rotor side converter 166 being coupled to a single bridge circuit. In addition, the LSC 168 may also include a plurality of bridge circuits. Similar to the rotor side converter 166, the line side converter 168 also includes a single bridge circuit for each output phase of the line side converter 168. In other embodiments, the line side converter 168, the rotor side converter 166, or both the line side converter 168 and the rotor side converter 166 may include parallel bridge circuits without deviating from the scope of the present disclosure.

Each bridge circuit may generally include a plurality of power semiconductor devices 194, 195 (e.g. IGBTs, IGCTs, GCTs, diodes, and/or MOSFETs) coupled in series with one another via an electrical bus (e.g. buses 156, 188). For instance, as shown in FIG. 3, each bridge circuit includes at least one upper IGBT (e.g. IGBT 194) and at least one lower IGBT (e.g. IGBT 195). In addition, a diode may be coupled in parallel with each of the IGBTs. In alternative embodiments, parallel IGBTs and diodes may be used to increase the current rating of the converter.

As is generally understood, the line side converter 168 and the rotor side converter 166 may be controlled, for instance, by providing control commands, using a suitable driver circuit, to the gates of the IGBTs. For example, the converter controller 174 may provide suitable gate timing commands to the gates of the IGBTs of the bridge circuits. The control commands may control the switching frequency of the IGBTs to provide a desired output. It should be appreciated by those of ordinary skill in the art that, as an alternative to IGBTs, the power convertor 162 may include any other suitable power semiconductor devices, such as, IGCTs, GCTs, diodes, and/or MOSFETs.

Figure 5:
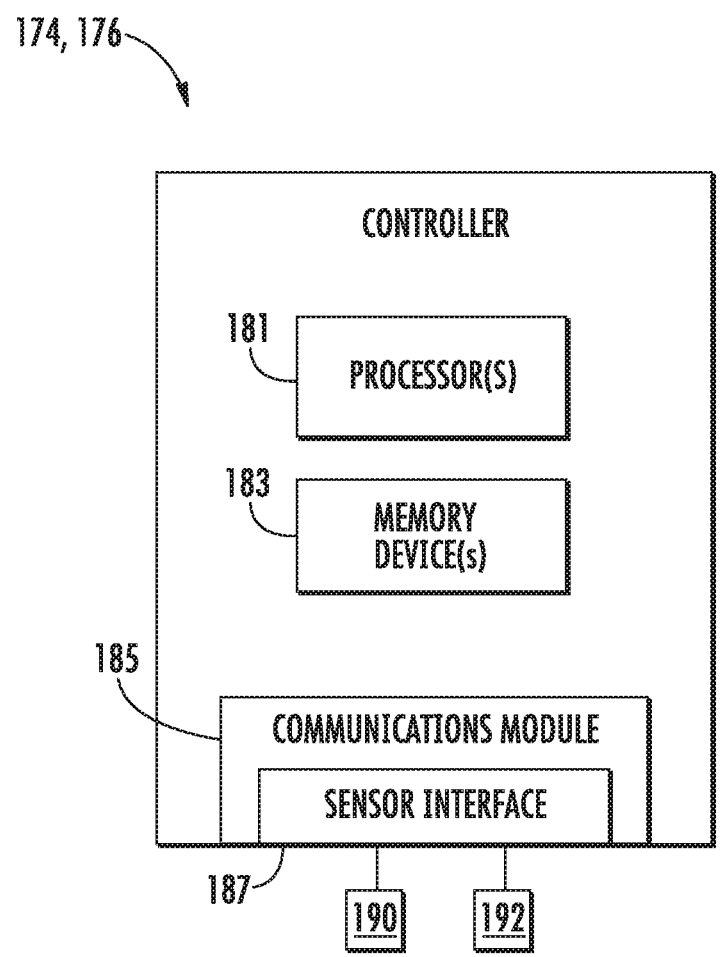
FIG. 5 illustrates a schematic view of one embodiment of a controller according to the present disclosure.

It should be appreciated that the converter controller 174 and turbine controller 176 may each correspond to any suitable computing device and/or any combination of computing devices. For instance, as shown in FIG. 5, the controller(s) 174, 176 may one or more processor(s) 181 and associated memory device(s) 183 configured to perform a variety of computer-implemented functions and/or instructions (e.g., performing the methods, steps, calculations and the like and storing relevant data as disclosed herein). The instructions when executed by the processor(s) 181 can cause the processor(s) 181 to perform operations, including providing control commands (e.g. pulse width modulation commands) to the power semiconductor devices of the power converter 162 and other aspects of the power system 100.

Figure 4:
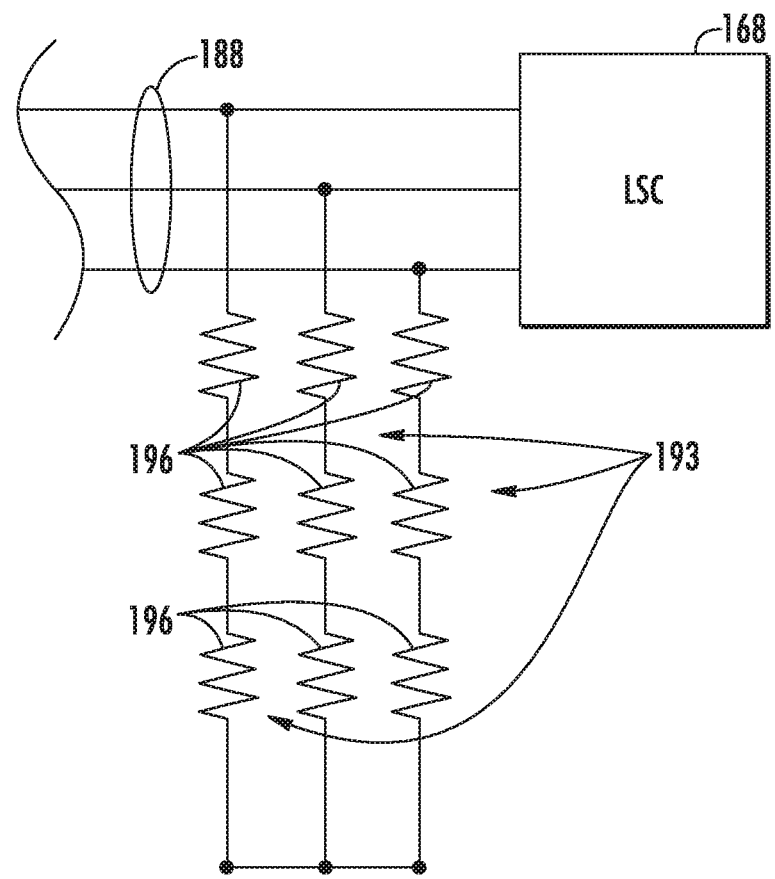
FIG. 4 illustrates a schematic diagram of one embodiment of a portion of a power converter of a wind turbine according to the present disclosure, particularly illustrating a plurality of heaters coupled directly to the line side bus.

Additionally, the controller(s) 174, 176 may also include a communications module 185 to facilitate communications between the controller(s) 174, 176 and the various components of the power system 100, e.g. any of the components of FIGS. 1-4. Further, the communications module 185 may include a sensor interface 187 (e.g., one or more analog-to-digital converters) to permit signals transmitted from one or more sensors (e.g. sensors 190, 192) to be converted into signals that can be understood and processed by the processor(s) 181. Though any suitable sensors may be utilized, sensors 190, 192 are provided to monitor temperature both inside and outside of the electrical cabinet, e.g. as shown in FIG. 4.

It should be appreciated that sensors (e.g. sensors 190, 192) may be communicatively coupled to the communications module 185 using any suitable means. For example, as shown in FIG. 5, the sensors 190, 192 are coupled to the sensor interface 187 via a wired connection. However, in other embodiments, the sensors 190, 192 may be coupled to the sensor interface 187 via a wireless connection, such as by using any suitable wireless communications protocol known in the art. As such, the processor(s) 181 may be configured to receive one or more signals from the sensors 190, 192.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor(s) 181 is also configured to compute advanced control algorithms and communicate to a variety of Ethernet or serial-based protocols (Modbus, OPC, CAN, etc.).

Additionally, the memory device(s) 183 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 183 may generally be configured to store suitable computer-readable instructions that, when implemented by the processor(s) 181, configure the controller(s) 174, 176 to perform the various functions as described herein.

Referring to FIGS. 3 and 4, the power system 100 may also include one or more heaters 193 to the electrical bus(es) 156, 188. For example, as shown, each of the electrical buses 156, 188 includes at least one heater 193. More specifically, as shown in FIG. 4, each phase of bus 188 may include a heater 193 coupled thereto. In such embodiments, as shown, each of the heaters 193 may include one or more of the power resistors 196. In addition, as shown, each of the heaters 193 may include a plurality of the power resistors 196 connected in series to each phase of the three-phase power system 100. In particular embodiments, the power resistors 196 may be constructed of any suitable conducting material, such as copper or nichrome.

Figure 6:
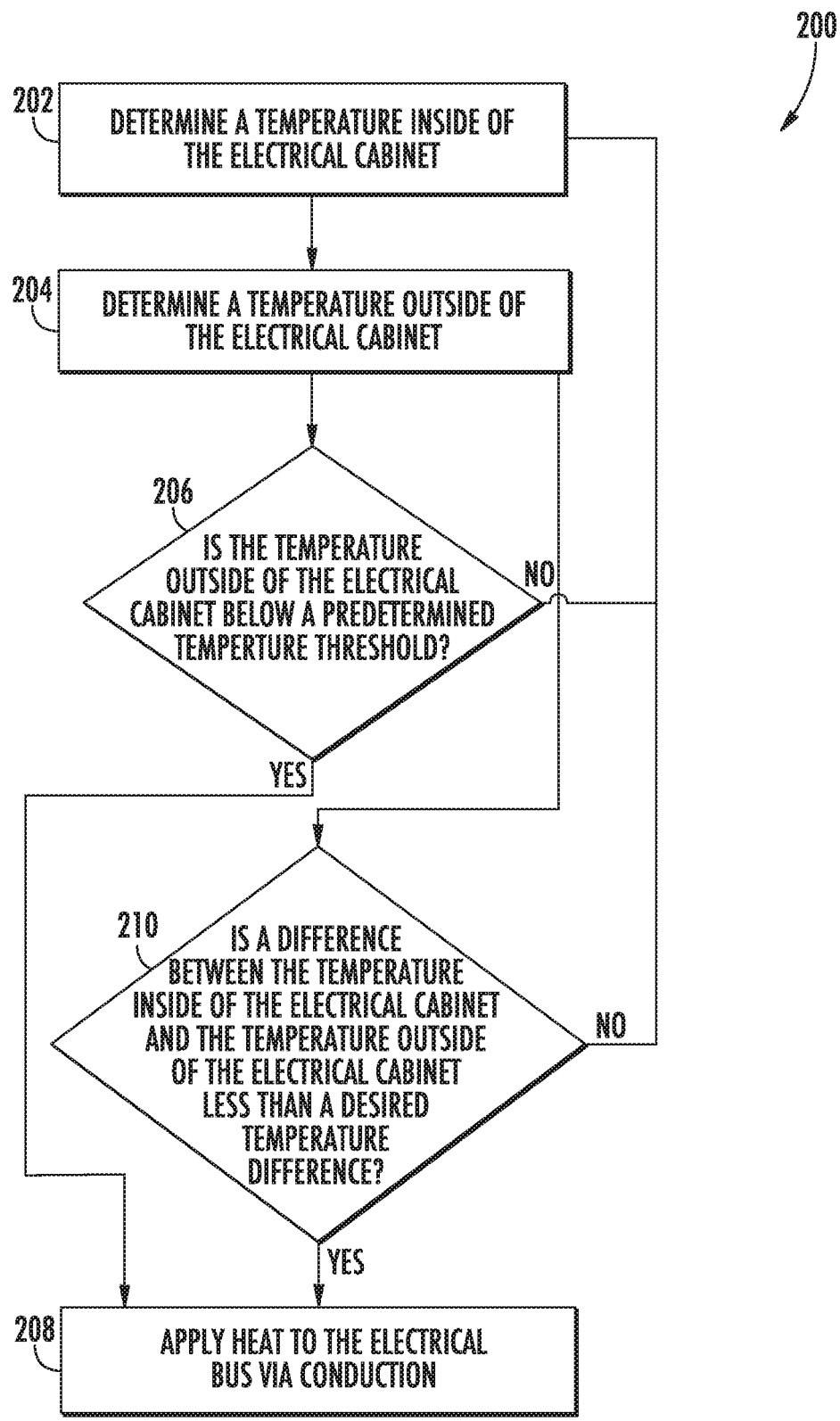
FIG. 6 illustrates a flow diagram of one embodiment of a method for heating an electrical bus in an electrical cabinet containing at least one current conversion device according to the present disclosure.

Referring now to FIG. 6, a flow diagram of an embodiment of a method 200 for heating an electrical bus in an electrical cabinet containing at least one current conversion device (such as the buses 156, 188) is illustrated in accordance with aspects of the present disclosure. In general, the method 200 is described herein as implemented using, for example, the power conversion assembly 162, the electrical cabinet 177, and the electrical buses 156, 188 described above. However, it should be appreciated that the disclosed method 200 may be implemented using any other suitable power system. In addition, although FIG. 6 depicts steps performed in a particular order for purposes of illustration and discussion, the methods described herein are not limited to any particular order or arrangement. One skilled in the art, using the disclosures provided herein, will appreciate that various steps of the methods can be omitted, rearranged, combined and/or adapted in various ways.

As shown at (202), the method 200 includes determining a temperature inside of the electrical cabinet 177. As shown at (204), the method 200 also includes determining a temperature outside of the electrical cabinet 177. For example, as shown in FIG. 3, at least one sensor 190 may be positioned inside of the electrical cabinet 177 for monitoring a temperature therein. In addition, as shown, at least one sensor 192 may be positioning outside of the electrical cabinet 177 for monitoring the temperature surrounding the cabinet (such as an ambient or environmental temperature). In alternative embodiments, the controllers 174, 176 described herein may be configured to estimate the temperature both inside and outside of the electrical cabinet 177.

Referring still to FIG. 6, as shown at (206), the method 200 includes determining whether the temperature outside of the electrical cabinet 177 is below a predetermined temperature threshold. If so, as shown at (208), the method 200 includes applying heat to the electrical bus(es) 156, 188 via conduction. In addition, as shown at (210), the method includes determining whether a difference between the temperature inside of the electrical cabinet 177 and the temperature outside of the electrical cabinet 177 is less than a desired temperature difference. If so, again as shown at (208), the method 200 includes applying heat to the electrical bus(es) 156, 188 via conduction.

For example, in one embodiment, the controller 174 is configured to command the heaters 193 to apply heat to the electrical bus(es) 156, 188 via conduction when the temperature outside of the electrical cabinet 177 is below a predetermined temperature threshold or a difference between the temperature inside of the electrical cabinet 177 and the temperature outside of the electrical cabinet 177 is less than a desired temperature difference.

In additional embodiments, the predetermined temperature threshold may be set to ensure there is no frost or liquid water present, thereby reducing the effectiveness of engineered insulation. In addition, the predetermined temperature threshold may be set to maintain a temperature rise over the incoming cooling air to ensure condensation does not form on the surfaces of the electrical components. Moreover, the predetermined temperature threshold may be set to ensure the electrical components stay at a temperature that is within their rated operating temperature range. In other words, frost or liquid water would normally cause failure of one or more components (such as the various power semiconductor devices 194, 195) in the current conversion device(s) 175 connected together via the electrical bus(es) 156, 188 without applying the heat directly to the bus(es) 156, 188. For example, in one instance, the power semiconductor devices 194, 195 may fail due to operating the devices 194, 195 below a minimum operating temperature. Alternatively, the power semiconductor devices 194, 195 may short out due to condensation forming thereon, i.e. if the cabinet and the surrounding environment are at or around freezing temperatures. Therefore, as an example, in an embodiment, the predetermined temperature threshold may be set to 10 degrees Celsius (° C.), more preferably 5° C., still more preferably 0° C. Even at mild temperatures, a small temperature rise is also important to maintain between the inside of the cabinet 177 and outside of the cabinet 177, otherwise, condensation may also form and short out the components therein.

In another embodiment, the method 200 may also include determining ohmic values for each of the power resistors 196 via computer-implemented numerical modeling (such as finite element analysis), e.g. based on one or more site parameters of the electrical cabinet 177. In such embodiments, the ohmic values are configured to achieve a desired heat flux for the electrical cabinet 177.

Various aspects and embodiments of the present invention are defined by the following numbered clauses:

Clause 1. A method for heating an electrical bus in an electrical cabinet containing at least one current conversion device, the method comprising:

determining a temperature inside of the electrical cabinet;

determining a temperature outside of the electrical cabinet; and, applying heat to the electrical bus via conduction when the temperature outside of the electrical cabinet is below a predetermined temperature threshold or a difference between the temperature inside of the electrical cabinet and the temperature outside of the electrical cabinet is less than a desired temperature difference.

Clause 2. The method of Clause 1, wherein the at least one current conversion device comprises at least one of a power converter or a power inverter.

Clause 3. The method of any of the preceding clauses, wherein applying heat to the electrical bus via conduction further comprises coupling one or more heaters to the electrical bus.

Clause 4. The method of Clause 3, wherein the one or more heaters comprise one or more power resistors.

Clause 5. The method of Clause 4, further comprising placing a thermal interface material between the one or more power resistors and the electrical bus.

Clause 6. The method of Clause 4, wherein the at least one current conversion device is a three-phase power system, the method further comprising coupling at least one of the one or more power resistors to each phase of the three-phase power system.

Clause 7. The method of Clause 6, further comprising coupling a plurality of the power resistors connected in series to each phase of the three-phase power system.

Clause 8. The method of Clause 6, further comprising determining ohmic values for each of the power resistors via computer-implemented numerical modeling based on one or more site parameters of the electrical cabinet, the ohmic values configured to achieve a desired heat flux for the electrical cabinet.

Clause 9. The method of any of the preceding clauses, wherein the predetermined temperature threshold is 5 degrees Celsius.

Clause 10. The method of any of the preceding clauses, wherein the at least one current conversion device comprises one or more components comprising at least one of an insulated-gate bipolar transistor (IGBT), an integrated gate commutated thyristor (IGCT), a gate commutated thyristor (GCT), a diode, or a metal oxide semiconductor field effect transistor (MOSFET), a power bridge, a capacitor, a resistor, an inductor, a transformer, a contactor, or a fuse.

Clause 11. An electrical power system, comprising:
an electrical cabinet;
at least one current conversion device housed within the electrical cabinet, the at least one current conversion device comprising a plurality of power semiconductor devices connected together via an electrical bus;
one or more sensors for determining a temperature inside and of the electrical cabinet;
one or more heaters to the electrical bus; and,
a controller communicatively coupled to the one or more sensors and the one or more heaters, the controller configured for commanding the one or more heaters to apply heat to the electrical bus via conduction when the temperature outside of the electrical cabinet is below a predetermined temperature threshold or a difference between the temperature inside of the electrical cabinet and the temperature outside of the electrical cabinet is less than a desired temperature difference.

Clause 12. The electrical power system of Clause 11, wherein the at least one current conversion device comprises at least one of a power converter or a power inverter.

Clause 13. The electrical power system of Clauses 11-12, wherein the one or more heaters comprise one or more power resistors.

Clause 14. The electrical power system of Clauses 11-13, wherein the one or more power resistors are constructed of nichrome wire.

Clause 15. The electrical power system of Clause 13, wherein the at least one current conversion device is a three-phase power system, at least one of the one or more power resistors being coupled to each phase of the three-phase power system.

Clause 16. The electrical power system of Clause 15, wherein the one or more power resistors further comprise a plurality of the power resistors connected in series to each phase of the three-phase power system.

Clause 17. The electrical power system of Clause 15, wherein the controller is further configured to determine ohmic values for each of the power resistors via computer-implemented numerical modeling based on one or more site parameters of the electrical cabinet, the ohmic values configured to achieve a desired heat flux for the electrical cabinet.

Clause 18. The electrical power system of Clauses 11-17, wherein the predetermined temperature threshold is set to represent a cold weather environment outside of the electrical cabinet, wherein the cold weather environment would cause failure of one or more components in the at least one current conversion device connected together via the electrical bus without applying the heat to the electrical bus due to operating the one or more components below a minimum operating temperature or condensation forming on the one or more components.

Clause 19. The electrical power system of Clause 18, wherein the one or more components comprises at least one of an insulated-gate bipolar transistor (IGBT), an integrated gate commutated thyristor (IGCT), a gate commutated thyristor (GCT), a diode, or a metal oxide semiconductor field effect transistor (MOSFET).

Clause 20. The electrical power system of Clauses 11-19, wherein the electrical power system is a renewable energy power system, the renewable energy power system comprising at least one of a wind turbine power system, a solar power system, or an energy storage power system.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for heating an electrical bus in an electrical cabinet containing at least one current conversion device, the at least one current conversion device is a three-phase power system, the method comprising:
determining a temperature inside of the electrical cabinet;
determining a temperature outside of the electrical cabinet;
applying heat to the electrical bus via conduction when the temperature outside of the electrical cabinet is below a predetermined temperature threshold, wherein applying heat to the electrical bus via conduction further comprises coupling one or more heaters to the electrical bus, the one or more heaters comprising one or more power resistors; and
coupling at least one of the one or more power resistors to each phase of the three-phase power system.

2. The method of claim 1, wherein the at least one current conversion device comprises at least one of a power converter or a power inverter.

3. The method of claim 1, further comprising placing a thermal interface material between the one or more power resistors and the electrical bus.

4. The method of claim 1, further comprising coupling a plurality of the power resistors connected in series to each phase of the three-phase power system.

5. The method of claim 1, further comprising determining ohmic values for each of the power resistors via computer-implemented numerical modeling based on one or more site parameters of the electrical cabinet, the ohmic values configured to achieve a desired heat flux for the electrical cabinet.

6. The method of claim 1, wherein the predetermined temperature threshold is 5 degrees Celsius.

7. The method of claim 1, wherein the at least one current conversion device comprises one or more components comprising at least one of an insulated-gate bipolar transistor (IGBT), an integrated gate commutated thyristor (IGCT), a gate commutated thyristor (GCT), a diode, or a metal oxide semiconductor field effect transistor (MOSFET), a power bridge, a capacitor, a resistor, an inductor, a transformer, a contactor, or a fuse.

8. An electrical power system, comprising:
an electrical cabinet;
at least one current conversion device housed within the electrical cabinet, the at least one current conversion device is a three-phase power system, the at least one current conversion device comprising a plurality of power semiconductor devices connected together via an electrical bus;

one or more sensors for determining a temperature inside and of the electrical cabinet;

one or more heaters to the electrical bus, wherein the one or more heaters comprise one or more power resistors, wherein at least one of the one or more power resistors is coupled to each phase of the three-phase power system, wherein the one or more power resistors further comprise a plurality of the power resistors connected in series to each phase of the three-phase power system; and, a controller communicatively coupled to the one or more sensors and the one or more heaters, the controller configured for commanding the one or more heaters to apply heat to the electrical bus via conduction when the temperature outside of the electrical cabinet is below a predetermined temperature threshold.

9. The electrical power system of claim 8, wherein the at least one current conversion device comprises at least one of a power converter or a power inverter.

10. The electrical power system of claim 8, wherein the one or more power resistors are constructed of nichrome wire.

11. The electrical power system of claim 8, wherein the controller is further configured to determine ohmic values for each of the power resistors via computer-implemented numerical modeling based on one or more site parameters of the electrical cabinet, the ohmic values configured to achieve a desired heat flux for the electrical cabinet.

12. The electrical power system of claim 8, wherein the predetermined temperature threshold is set to represent a cold weather environment outside of the electrical cabinet, wherein the cold weather environment would cause failure of one or more components in the at least one current conversion device connected together via the electrical bus without applying the heat to the electrical bus due to operating the one or more components below a minimum operating temperature or condensation forming on the one or more components.

13. The electrical power system of claim 12, wherein the one or more components comprises at least one of an insulated-gate bipolar transistor (IGBT), an integrated gate commutated thyristor (IGCT), a gate commutated thyristor (GCT), a diode, or a metal oxide semiconductor field effect transistor (MOSFET).

14. The electrical power system of claim 8, wherein the electrical power system is a renewable energy power system, the renewable energy power system comprising at least one of a wind turbine power system, a solar power system, or an energy storage power system.

\* \* \* \* \*